United States Patent
Chang et al.

(10) Patent No.: US 8,268,684 B2
(45) Date of Patent: *Sep. 18, 2012

(54) METHOD AND APPARATUS FOR TRENCH AND VIA PROFILE MODIFICATION

(75) Inventors: Mei Chang, Saratoga, CA (US); Chien-Teh Kao, Sunnyvale, CA (US); Xinliang Lu, Fremont, CA (US); Zhenbin Ge, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/205,379

(22) Filed: Aug. 8, 2011

(65) Prior Publication Data

US 2011/0294258 A1 Dec. 1, 2011

Related U.S. Application Data

(63) Continuation of application No. 12/620,799, filed on Nov. 18, 2009, now Pat. No. 7,994,002.

(60) Provisional application No. 61/117,531, filed on Nov. 24, 2008.

(51) Int. Cl.
 *H01L 21/00* (2006.01)
(52) U.S. Cl. ......... 438/243; 438/386; 438/629; 438/637
(58) Field of Classification Search .......... 438/424–432, 438/435–437, 386, 629, 637
 See application file for complete search history.

(56) References Cited

U.S. PATENT DOCUMENTS

| 4,784,720 | A | 11/1988 | Douglas |
| 4,807,016 | A | 2/1989 | Douglas |
| 5,030,319 | A | 7/1991 | Nishino et al. |
| 5,118,384 | A | 6/1992 | Harmon et al. |
| 5,282,925 | A | 2/1994 | Jeng et al. |
| 5,368,897 | A | 11/1994 | Kurihara et al. |
| 5,505,816 | A | 4/1996 | Barnes et al. |
| 5,578,130 | A | 11/1996 | Hayashi et al. |
| 5,846,375 | A | 12/1998 | Gilchrist et al. |
| 5,913,132 | A | 6/1999 | Tsai |
| 6,054,377 | A | 4/2000 | Filipiak et al. |

(Continued)

FOREIGN PATENT DOCUMENTS

CN 1822328 A 8/2006

(Continued)

OTHER PUBLICATIONS

EP Partial Search Report, Application No. 08150111.6-1235 / 1944796, dated Aug. 22, 2008.

(Continued)

*Primary Examiner* — Richard A. Booth
(74) *Attorney, Agent, or Firm* — Patterson & Sheridan, LLP

(57) ABSTRACT

Embodiments of the present invention generally relates to an apparatus and a method for processing semiconductor substrates. Particularly, embodiments of the present invention relates to methods and apparatus for profile modification prior to filling a structure, such as a trench or a via. One embodiment of the present invention comprises forming a sacrifice layer to pinch off a top opening of a structure by exposing the structure to an etchant. In one embodiment, the etchant is configured to remove the first material by reacting with the first material and generating a by-product, which forms the sacrifice layer.

20 Claims, 6 Drawing Sheets

U.S. PATENT DOCUMENTS

| | | | |
|---|---|---|---|
| 6,191,002 B1 | 2/2001 | Koyanagi | |
| 6,271,147 B1 | 8/2001 | Tseng | |
| 6,335,261 B1 | 1/2002 | Natzle et al. | |
| 6,372,657 B1 | 4/2002 | Hineman et al. | |
| 6,448,537 B1 | 9/2002 | Nering | |
| 6,500,728 B1 | 12/2002 | Wang et al. | |
| 6,506,291 B2 | 1/2003 | Tsai et al. | |
| 6,635,185 B2 | 10/2003 | Demmin et al. | |
| 6,670,278 B2 | 12/2003 | Li et al. | |
| 6,960,781 B2 | 11/2005 | Currie et al. | |
| 7,396,480 B2 | 7/2008 | Kao et al. | |
| 7,994,002 B2 * | 8/2011 | Chang et al. | 438/243 |
| 2001/0015261 A1 | 8/2001 | Kobayashi et al. | |
| 2002/0137337 A1 | 9/2002 | Lu et al. | |
| 2003/0173347 A1 | 9/2003 | Guiver | |
| 2003/0227013 A1 | 12/2003 | Currie et al. | |
| 2005/0205110 A1 | 9/2005 | Kao et al. | |
| 2005/0230350 A1 | 10/2005 | Kao et al. | |
| 2005/0266622 A1 | 12/2005 | Arghavani et al. | |
| 2006/0051968 A1 | 3/2006 | Joshi et al. | |
| 2006/0130971 A1 | 6/2006 | Chang et al. | |
| 2006/0185592 A1 | 8/2006 | Matsuura | |
| 2006/0223323 A1 | 10/2006 | Chen et al. | |
| 2007/0087573 A1 | 4/2007 | Chiang et al. | |
| 2007/0123051 A1 | 5/2007 | Arghavani et al. | |
| 2008/0160210 A1 | 7/2008 | Yang et al. | |

FOREIGN PATENT DOCUMENTS

| | | |
|---|---|---|
| EP | 0376252 A2 | 7/1990 |
| EP | 0658928 A1 | 6/1995 |
| EP | 1099776 | 5/2001 |
| EP | 1568797 A2 | 8/2005 |
| JP | 2000208498 A | 7/2000 |
| JP | 2001053055 A | 2/2001 |
| JP | 2003133284 A | 5/2003 |
| KR | 100593740 A | 3/2006 |

OTHER PUBLICATIONS

H. Nishino, N. Hayasaka, and H. Okano, Damage-Free Selective Etching of SI Native Oxides Using $NH_3/NF_3$ and $SF_6/H_2O$ Down-Flow Etching, The Japanese Society of Applied Physics, vol. 74, No. 2, pp. 1345-1348, XP-002491959, Jul. 15, 1993.

International Search Report and Written Opinion dated Jun. 23, 2009 for International Application No. PCT/US2008/087436.

International Search Report and Written Opinion of the International Searching Authority mailed Jul. 3, 2008 (PCT/US05/46226).

Notification of First Office Action for Chinese Patent Application No. 2008100007537 dated Mar. 20, 2009.

Ogawa et al article, "Dry Cleaning Technology for Removal of Silicon Native Oxide Employing Hot NH3/NF3 Exposure," Jpn J Appl Phys, vol. 41 (2002), pp. 5349-5358.

PCT International Search Report and Written Opinion dated Jun. 29, 2010 for International Application No. PCT/US2009/065208.

* cited by examiner

US 8,268,684 B2

METHOD AND APPARATUS FOR TRENCH AND VIA PROFILE MODIFICATION

CROSS-REFERENCE TO RELATED APPLICATIONS

This application is a continuation of co-pending U.S. patent application Ser. No. 12/620,799, filed Nov. 18, 2009, which claims benefit of U.S. Provisional Patent Application Ser. No. 61/117,531, filed Nov. 24, 2008. Each of the aforementioned patent applications is herein incorporated by reference.

BACKGROUND OF THE INVENTION

1. Field of the Invention

Embodiments of the present invention generally relate to an apparatus and a method for processing semiconductor substrates. Particularly, embodiments of the present invention relates to methods and apparatus for trench and via profile modification prior to filling the trench and via.

2. Description of the Related Art

With continues decreasing of semiconductor device dimensions, trench or via structures formed on a semiconductor substrate during fabrication become increasingly narrow and high in aspect ratio. Narrow opening and high aspect ratio usually present difficulties and challenges for subsequent material filling process. As a result, voids are more likely to form in the filling material because the narrow openings would be pinched off during filling process.

The problem becomes more pronounced when a liner, barrier, or seed layer is requested for the filling process. The liner, barrier or seed layer is usually deposited on the trench or via structure using a physical vapor deposition (PVD) process. To achieve a complete coverage over the trench or via surfaces, overhangs usually form near an entrance of the trench or via. The overhangs worsen the pinch off in the subsequent material filling causing more voids formed in the filling.

FIGS. 1A-1B schematically illustrate problems in trench and via filling. FIG. 1A schematically illustrates a partial sectional side view of a substrate 10. A trench structure 2 is formed in a first material 1. A barrier layer 3 is then deposited over the trench structure 2. The barrier layer 3 is thicker near an entrance 8 of the trench structure 2 and forms overhangs 4 near the entrance 8. The overhangs 4 further narrow the entrance 8.

FIG. 1B schematically illustrates a material filling result of the substrate 10 of FIG. 1A. The entrance 8 is closed up by a filling material 5 prior to filling in the rest of the trench structure 2 forming a void 6 in the trench structure 2. The void 6 is usually undesirable especially when the filling material 5 is a conductive material (copper or aluminum) for interconnect, Germanium-Selenium-Tellurium (GST) fill for phase change memory cell, gate metal filling for metal gates.

Conventional fabrication process generally uses a sputtering process to modify the entrance 8 prior to depositing the filling material 5. As shown in FIG. 1C, positive ions 6, such as positive argon ions, generated in a plasma chamber are accelerated towards the substrate 10. The positive ions 6 gain momentum during acceleration and strike top surfaces of the substrate 10. The ions 6 physically dislodged the overhangs 4 to open up the entrance 8, as show in modified profile 7. However, the ions 6 also strike other areas outside the overhangs 4 damaging the substrate 10. Additionally, the dislodged particles generated during sputtering require additional cleaning process and may still become potential source of contamination for subsequent processing.

Therefore, there is a need for methods and apparatus to modify trench and via profile before material filling with increased efficiency and reduced damage.

SUMMARY OF THE INVENTION

Embodiments of the present invention generally relate to an apparatus and a method for processing semiconductor substrates. Particularly, embodiments of the present invention relates to methods and apparatus for trench and via profile modification prior to filling the trench and via.

One embodiment provides a method for processing a substrate comprising forming a trench structure in the substrate, wherein sidewalls of the trench structure comprises a first material, forming a sacrifice layer to pinch off a top opening of the trench structure by exposing the substrate to an etchant, wherein the sacrifice layer comprises a by-product of a reaction between the etchant and the first material, allowing the etchant to further react with the first material by continuously exposing the substrate to the etchant, and removing the sacrifice layer from the substrate.

Another embodiment provides a method for processing a substrate comprising forming a trench structure on the substrate, wherein sidewalls of the trench structure comprises a first material, widening a top opening of the trench structure, wherein widening the upper opening comprises forming a sacrifice layer to pinch off the top opening of the trench structure by exposing the substrate to an etchant, wherein the sacrifice layer comprises a by-product of an reaction between the etchant and the first material, allowing the etchant to further react with the first material by continuously exposing the substrate to the etchant, and removing the sacrifice layer from the substrate, depositing a second material to fill the trench structure.

Yet another embodiment provides a method for processing a substrate comprising positioning the substrate in a processing chamber, wherein the substrate has a trench structure, and sidewalls of the trench structure comprise a first material, flowing a first processing gas to the processing chamber to form a sacrifice layer to pinch off a top opening of the trench structure, continuing the flow of the first processing gas after the top opening has been pinched off, and annealing the substrate to remove the sacrifice layer from the trench structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relates to an apparatus and a method for processing semiconductor substrates. Particularly, embodiments of the present invention relates to methods and apparatus for trench and via profile modification prior to filling the trench and via.

One embodiment of the present invention comprises forming a sacrifice layer to pinch off a top opening of a trench structure by exposing the trench structure to an etchant. In one embodiment, the etchant is configured to remove the first material by reacting with the first material and generating a by-product, which forms the sacrifice layer. The sacrifice layer restrains the access of the etchant from sidewalls of the trench structure allowing more material removed near the top opening of the trench structure. The profile of the trench structure is modified to have a widened opening after removing the sacrifice layer from the substrate.

Compared with conventional sputtering trench profile modification, methods of the present invention do not expose substrates being processed to physical damage. In one embodiment, a dry etching method is used to form the sacrifice layer. The sacrifice layer can be removed by annealing in the same dry etching chamber, thus, increasing efficiency and reducing cross contamination.

Methods and apparatus of the present invention can be used to modify profile of bare trench and via structures, on trench and via structures having a liner, a barrier and/or a seed layer deposited thereon.

Figure 1A:
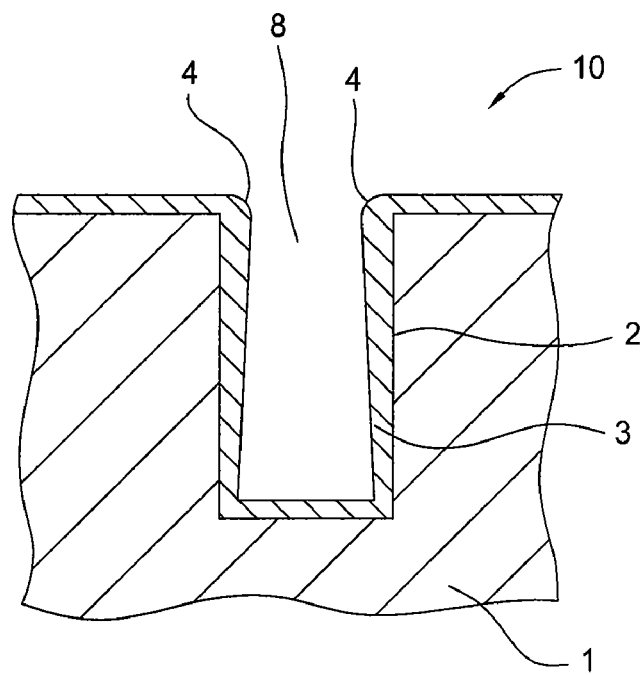
FIGS. 1A-1B schematically illustrate problems in trench and via filling.
Figure 1B:
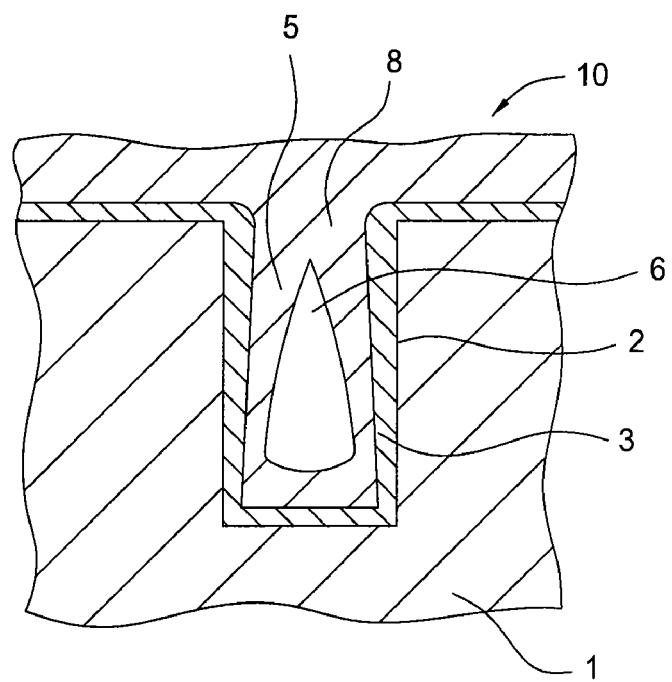
Figure 1C:
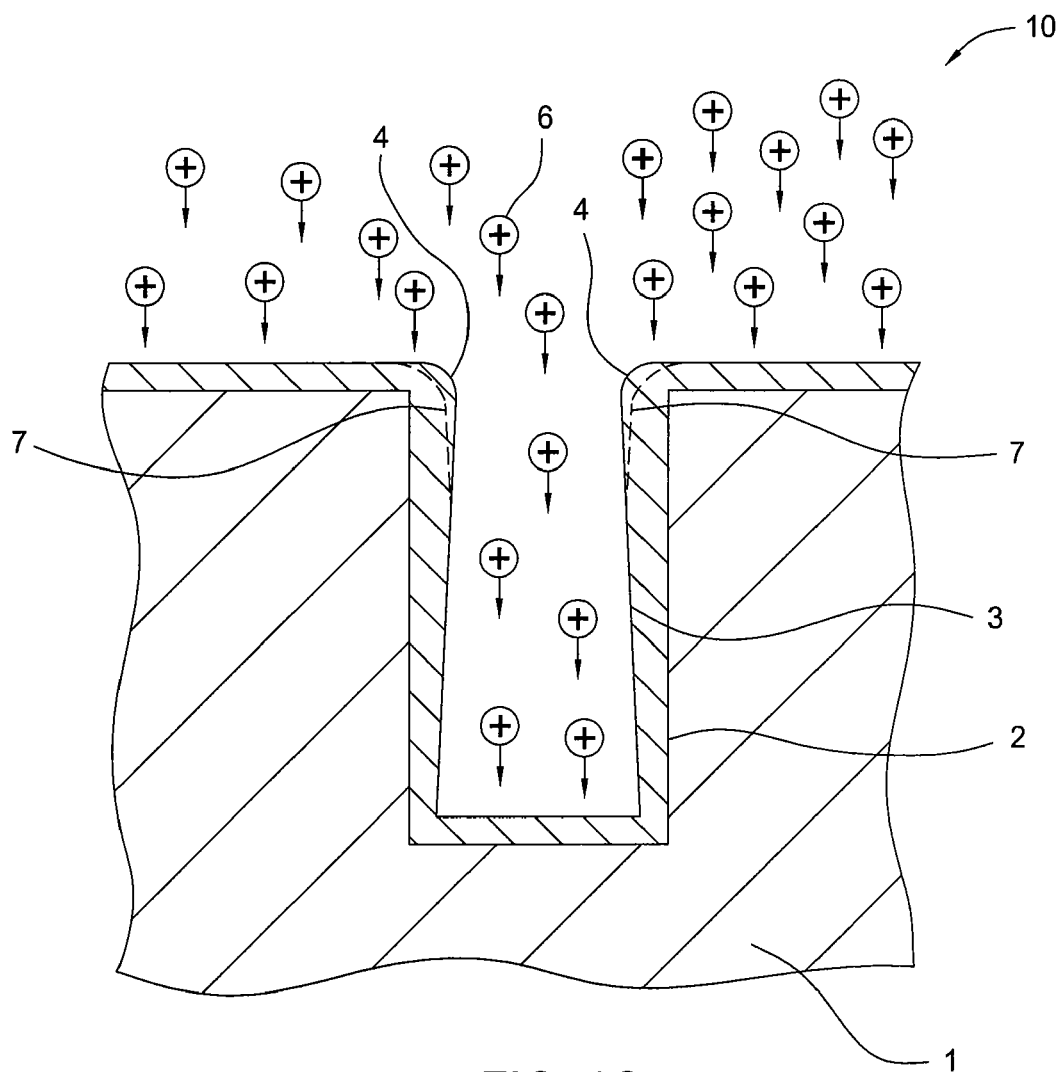
FIG. 1C schematically illustrates a conventional method for modifying trench and via profile.
Figure 2A:
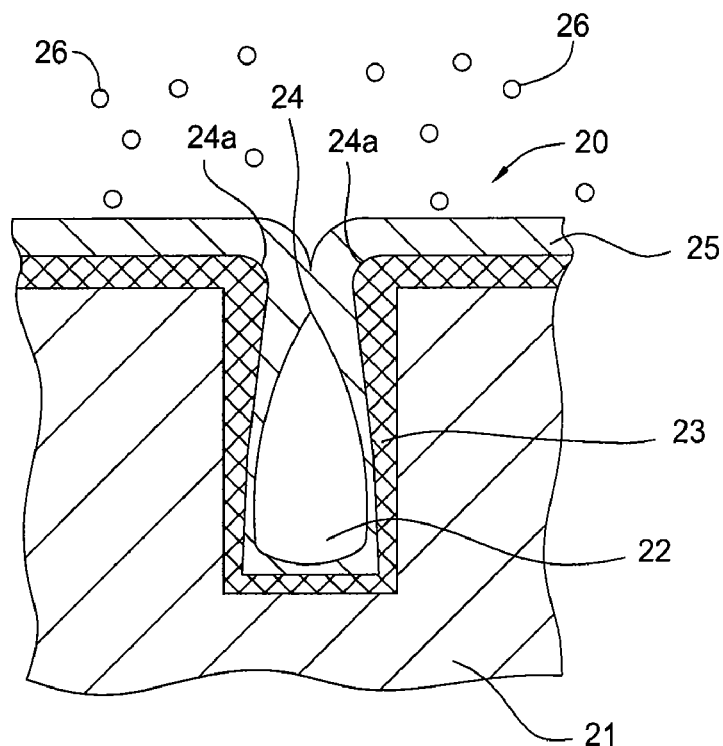
FIGS. 2A-2B schematically illustrate a method for modifying a trench profile prior to material filling in accordance with one embodiment of the present invention.
Figure 2B:
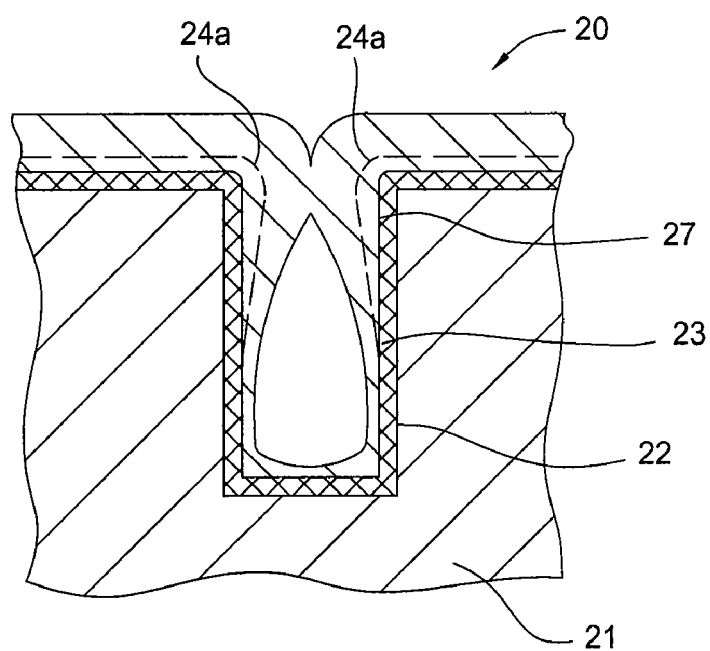
Figure 3:
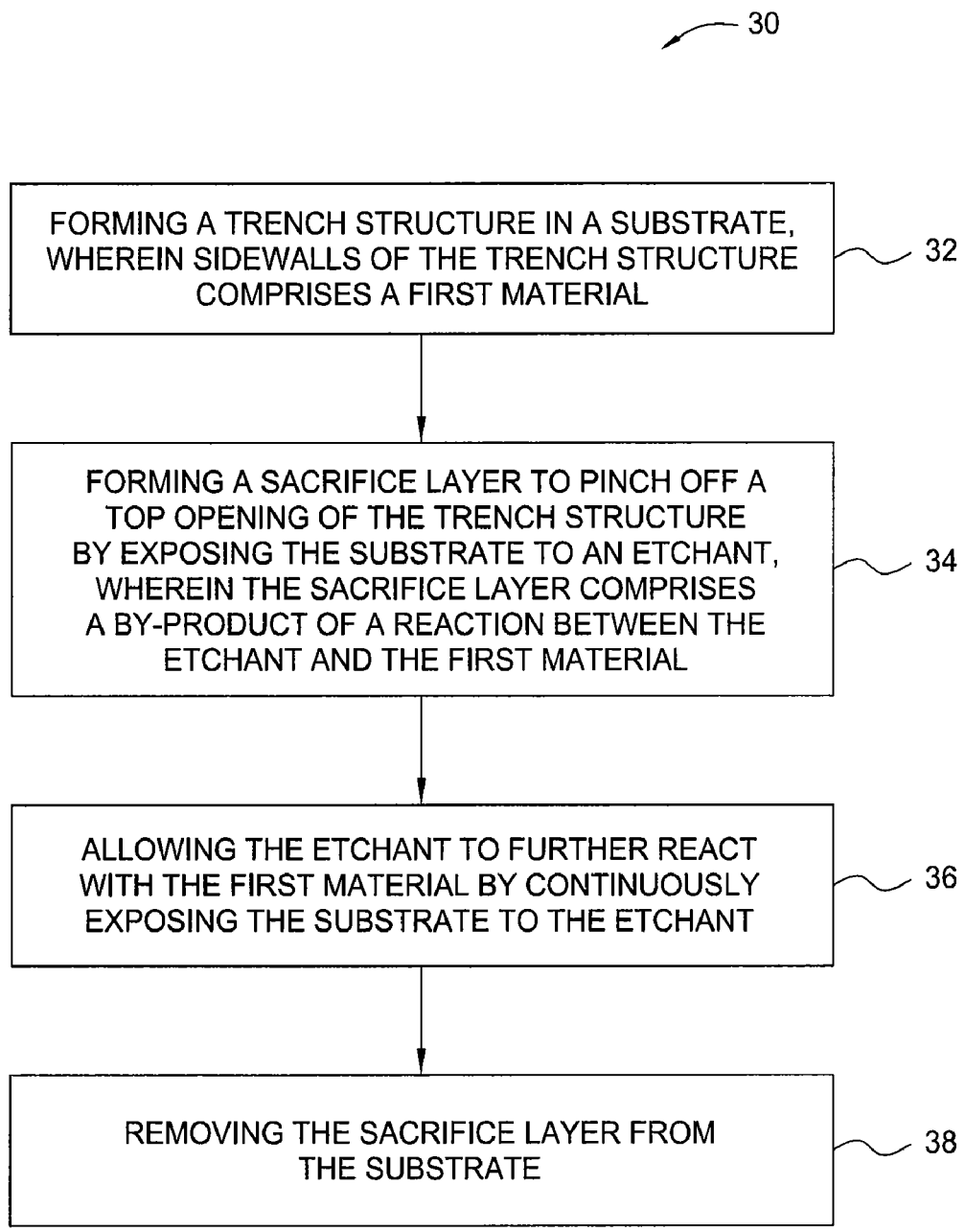
FIG. 3 is a schematic flow chart showing a process for modifying a trench profile in accordance with one embodiment of the present invention.

FIGS. 2A-2B schematically illustrate a method for modifying a trench profile prior to material filling in accordance with one embodiment of the present invention. FIG. 3 is a schematic flow chart showing a process 30 for modifying a trench profile shown in FIGS. 2A-2B.

Block 32 of the process 30 comprises forming a trench structure 22 in a base layer 21 of a substrate 20 as shown in FIG. 2A. In one embodiment, the base layer 21, hence, sidewalls of the trench structure 22 comprise a first material. In another embodiment, forming the trench structure 22 may comprise depositing a liner, barrier or seed layer 23 having the first material may be deposited over the substrate 20.

As shown in FIG. 2A, the trench structure 22 has overhangs 24a formed near a top opening 24.

Block 34 of the process 30 comprises forming a sacrifice layer 25 to pinch off the top opening 24 of the trench structure 22 by exposing the substrate 20 to an etchant. In one embodiment, the etchant is configured to etch away the first material by reacting with the first material and to generating a by-product from reaction with the first material. The sacrifice layer 25 comprises the by-product generated from reaction between the etchant and the first material.

In one embodiment, forming the sacrifice layer 25 comprises increasing a rate of reaction between the first material and the etchant. The increased reaction rate between the first material and the etchant causes the by-product to form quickly near the top opening 24 before the by-product can be evenly formed within the trench structure 22.

In one embodiment, increasing the reaction rate between the first material and the etchant may be achieved by increasing a flow rate of one or more processing gas of the etchant.

In one embodiment, forming the sacrifice layer 25 comprises determining the reaction rate between the first material and the etchant according to a target trench profile. A higher reaction rate corresponds to a higher ratio of removal amount between a top portion of the trench structure 22 and a lower portion of the trench structure 22. A lower reaction rate corresponds to a lower ratio of removal amount between the top portion and the lower portion. Accordingly, increasing the reaction rate increases an opening angle of the sidewalls and reducing the reaction rate reduces the opening angle of the sidewalls.

Block 36 of the process 30 comprising allowing the etchant to further reacting with the first material by continuously exposing the substrate 20 to the etchant, as shown in FIG. 2A.

After the sacrifice layer 25 pinches off the top opening, active species 26 in the etchant may still be able to diffuse through the sacrifice layer 25 from a top surface of the sacrifice layer 25 and react with the first material underneath. However, diffusion distance varies significantly along sidewalls of the trench structure 22. Therefore, this leads to fast etching around the top opening 24 significant reduced etching down the sidewalls of the trench structure 22.

In one embodiment, flow rate of the etchant may remain the same after the sacrifice layer 25 has pinched off the top opening 24. In another embodiment, flow rate of the etchant may be adjusted after the pinch off.

In one embodiment, a desired top opening widening can be achieved by varying etching time.

Block 38 of the process 30 comprises removing the sacrifice layer 25 and exposing a modified profile 27 of the trench structure 22.

In one embodiment, removing the sacrifice layer 25 may comprise annealing the substrate 20 to vaporize the sacrifice layer 25. In one embodiment, removing the sacrifice layer 25 can be performed in the same chamber where forming the sacrifice layer 25 and continued etching are performed.

In another embodiment, removing the sacrifice layer 25 comprising dissolving the sacrifice layer 25 in a solvent. In one embodiment, the solvent may be water.

Even though, FIG. 2A shows an example of a trench structure having overhangs formed near a top opening, embodiments of the present invention may be applied to modify trench structure without overhangs, such as trench structures with relatively straight walls.

As described above, any etching methods that produce a removable by-product can be used with embodiments of the present invention. Particularly etchant may be selected according to materials to be etched. Composition of etchant may also be determined by process requirement.

In one embodiment, a dry etching method is used in accordance with embodiment of the present invention. Embodiments of the present invention may use an etchant may be a fluorine, nitrogen, and hydrogen containing source.

In one embodiment, the etchant comprises one of a mixture of nitrogen trifluoride ($NF_3$) and ammonia ($NH_3$), a mixture of nitrogen trifluoride ($NF_3$) and hydrogen ($H_2$), a mixture of nitrogen trifluoride ($NF_3$), hydrogen ($H_2$), and nitrogen ($N_2$), a mixture of nitrogen trifluoride ($NF_3$) and hydrogen fluoride (HF), or other similar fluorine, nitrogen, and hydrogen containing source.

In one embodiment, the etchant comprises a fluorine containing source, such as $ClF_3$, $CH_3F$, $CHF_3$, and similar compounds.

One embodiment of the present invention comprises generating a plasma of a drying etching etchant comprising a mixture of nitrogen trifluoride ($NF_3$) and ammonia ($NH_3$), and exposing the plasma of the nitrogen trifluoride and ammonia to modify trench and/or via structures having sidewalls comprising silicon oxide, silicon, or silicon nitride. In one embodiment, the plasma may be generated remotely and flown to an etching chamber. In another embodiment, the plasma may be generated in-situ in an etching chamber.

Figure 4:
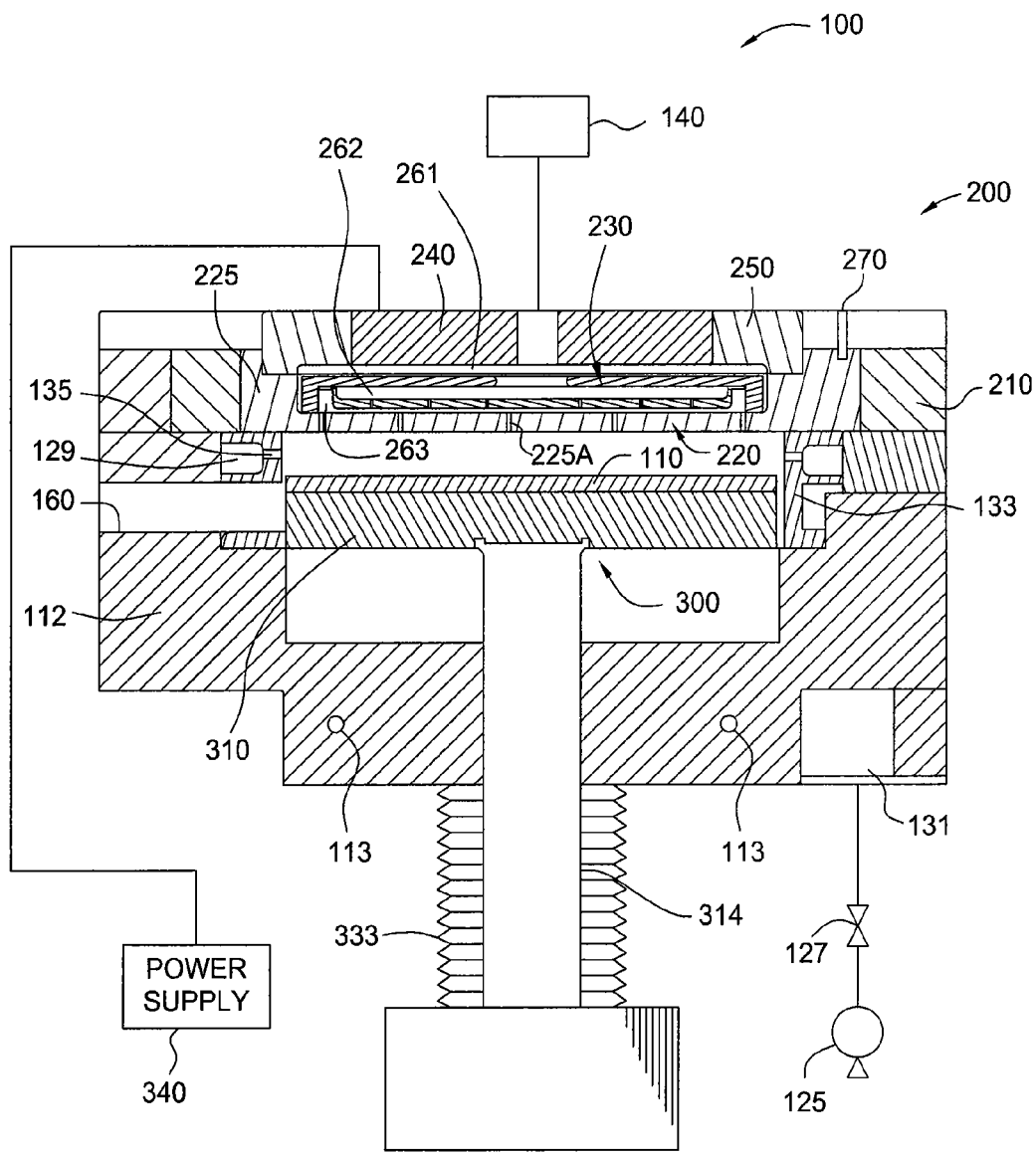
FIG. 4 is a schematic side view of a chamber for modifying a trench profile in accordance with one embodiment of the present invention.

FIG. 4 is a schematic side view of a processing chamber 100 for modifying a trench profile in accordance with one embodiment of the present invention.

The processing chamber 100 comprises a lid assembly 200 disposed at an upper end of a chamber body 112, and a support assembly 300 at least partially disposed within the chamber body 112. The processing chamber also includes a remote plasma generator 140 having a remote electrode with a U-shaped cross section. The processing chamber 100 and the associated hardware are preferably formed from one or more process-compatible materials, for example, aluminum, anodized aluminum, nickel plated aluminum, nickel plated aluminum 6061-T6, stainless steel, as well as combinations and alloys thereof.

The support assembly 300 is partially disposed within the chamber body 112. The support assembly 300 is raised and lowered by a shaft 314 which is enclosed by bellows 333. The chamber body 112 includes a slit valve opening 160 formed in a sidewall thereof to provide access to the interior of the chamber 100. The slit valve opening 160 is selectively opened and closed to allow access to the interior of the chamber body 112 by a wafer handling robot (not shown). Wafer handling robots are well known to those with skill in the art, and any suitable robot may be used. In one embodiment, a wafer can be transported in and out of the process chamber 100 through the slit valve opening 160 to an adjacent transfer chamber and/or load-lock chamber (not shown), or another chamber within a cluster tool. Illustrative cluster tools include but are not limited to the PRODUCER™, CENTURA™, ENDURA™, and ENDURASL™ platforms available from Applied Materials, Inc. of Santa Clara, Calif.

The chamber body 112 also includes a channel 113 formed therein for flowing a heat transfer fluid therethrough. The heat transfer fluid can be a heating fluid or a coolant and is used to control the temperature of the chamber body 112 during processing and substrate transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 further includes a liner 133 that surrounds the support assembly 300, and is removable for servicing and cleaning. The liner 133 is preferably made of a metal such as aluminum, or a ceramic material. However, any process compatible material may be used. The liner 133 may be bead blasted to increase the adhesion of any material deposited thereon, thereby preventing flaking of material which results in contamination of the chamber 100. The liner 133 typically includes one or more apertures 135 and a pumping channel 129 formed therein that is in fluid communication with a vacuum system. The apertures 135 provide a flow path for gases into the pumping channel 129, and the pumping channel provides a flow path through the liner 133 so the gases can exit the chamber 100.

The vacuum system may comprise a vacuum pump 125 and a throttle valve 127 to regulate flow of gases within the chamber 100. The vacuum pump 125 is coupled to a vacuum port 131 disposed on the chamber body 112, and is in fluid communication with the pumping channel 129 formed within the liner 133. The vacuum pump 125 and the chamber body 112 are selectively isolated by the throttle valve 127 to regulate flow of the gases within the chamber 100. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 200 comprises a number of components stacked together. For example, the lid assembly 200 comprises a lid rim 210, gas delivery assembly 220, and a top plate 250. The lid rim 210 is designed to hold the weight of the components making up the lid assembly 200 and is coupled to an upper surface of the chamber body 112 to provide access to the internal chamber components. The gas delivery assembly 220 is coupled to an upper surface of the lid rim 210 and is arranged to make minimum thermal contact therewith. The components of the lid assembly 200 are preferably constructed of a material having a high thermal conductivity and low thermal resistance, such as an aluminum alloy with a highly finished surface, for example. Preferably, the thermal resistance of the components is less than about $5 \times 10^{-4}$ $m^2$ K/W.

The gas delivery assembly 220 may comprise a gas distribution plate 225 or showerhead. A gas supply panel (not shown) is typically used to provide the one or more gases to the chamber 100. The particular gas or gases that are used depend upon the process to be performed within the chamber 100. For example, the typical gases include one or more precursors, reductants, catalysts, carriers, purge, cleaning, or any mixture or combination thereof. Typically, the one or more gases are introduced to the chamber 100 into the lid assembly 200 and then into the chamber body 112 through the gas delivery assembly 220. An electronically operated valve and/or flow control mechanism (not shown) may be used to control the flow of gas from the gas supply into the chamber 100.

In one aspect, the gas is delivered from the gas supply panel to the chamber 100 where the gas line tees into two separate gas lines which feed gases to the chamber body 112 as described above. Depending on the process, any number of gases can be delivered in this manner and can be mixed either in the chamber 100 or before they are delivered to the chamber 100.

Still referring to FIG. 4, the lid assembly 200 may further include an electrode 240 to generate a plasma of reactive species within the lid assembly 200. In this embodiment, the electrode 240 is supported on the top plate 250 and is electrically isolated therefrom. An isolator filler ring (not shown) is disposed about a lower portion of the electrode 240 separating the electrode 240 from the top plate 250. An annular isolator (not shown) is disposed about an upper portion of the isolator filler ring and rests on an upper surface of the top plate 250, as shown in FIG. 3. An annular insulator (not shown) is then disposed about an upper portion of the electrode 240 so that the electrode 240 is electrically isolated from the other components of the lid assembly 200. Each of these rings, the isolator filler and annular isolators can be made from aluminum oxide or any other insulative, process compatible material.

The electrode 240 is coupled to a power source 340 while the gas delivery assembly 220 is connected to ground. Accordingly, a plasma of the one or more process gases is struck in the volume formed between the electrode 240 and the gas delivery assembly 220. The plasma may also be contained within the volumes formed by blocker plates. In the absence of a blocker plate assembly, the plasma is struck and contained between the electrode 240 and the gas delivery assembly 220. In either embodiment, the plasma is well confined or contained within the lid assembly 200.

Any power source capable of activating the gases into reactive species and maintaining the plasma of reactive species may be used. For example, radio frequency (RF), direct current (DC), alternating current (AC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 100. Exemplary remote plasma generators are available from vendors such as MKS Instruments, Inc. and Advanced Energy Industries, Inc. Preferably, an RF power supply is coupled to the electrode 240.

The gas delivery assembly 220 may be heated depending on the process gases and operations to be performed within the chamber 100. In one embodiment, a heating element 270, such as a resistive heater for example, is coupled to the gas delivery assembly 220. In one embodiment, the heating element 270 is a tubular member and is pressed into an upper surface of the gas delivery assembly 220. The upper surface of the gas delivery assembly 220 includes a groove or recessed channel having a width slightly smaller than the outer diameter of the heating element 270, such that the heating element 270 is held within the groove using an interference fit.

The heating element 270 regulates the temperature of the gas delivery assembly 220 since the components of the delivery assembly 220, including the gas delivery assembly 220 and the blocker assembly 230 are each conductively coupled to one another. Additional details of the processing chamber may be found in U.S. patent application Ser. No. 11/063,645, filed Feb. 22, 2005 which is incorporated by reference herein.

The processing chamber 100 is particularly useful for performing a plasma assisted dry etching process that requires heating and cooling of the substrate surface without breaking vacuum. In one embodiment, the processing chamber 100 may be used to selectively remove one or more oxides on the substrate.

For simplicity and ease of description, an exemplary dry etch process for removing one or more silicon oxides using an ammonia ($NH_3$) and nitrogen trifluoride ($NF_3$) gas mixture performed within the processing chamber 100 will now be described. It is believed that the processing chamber 100 is advantageous for any dry etch process that benefits from a plasma treatment in addition to both substrate heating and cooling all within a single processing environment, including an anneal process.

Referring to FIG. 4, the dry etch process begins by placing a substrate 110, such as a semiconductor substrate for example, into the processing chamber 100. The substrate is typically placed into the chamber body 112 through the slit valve opening 160 and disposed on the upper surface of the support member 310. The substrate 110 may be chucked to the upper surface of the support member 310. Preferably, the substrate 110 is chucked to the upper surface of the support member 310 by pulling a vacuum. The support member 310 is then lifted to a processing position within the chamber body 112, if not already in a processing position. The chamber body 112 is preferably maintained at a temperature of between 50° C. and 80° C., more preferably at about 65° C. This temperature of the chamber body 112 is maintained by passing a heat transfer medium through the channel 113.

The substrate 110 is cooled below 65° C., such as between 15° C. and 50° C., by passing a heat transfer medium or coolant through fluid channels formed within the support assembly 300. In one embodiment, the substrate is maintained below room temperature. In another embodiment, the substrate is maintained at a temperature of between 22° C. and 40° C. Typically, the support member 310 is maintained below about 22° C. to reach the desired substrate temperatures specified above. To cool the support member 310, the coolant is passed through the fluid channel formed within the support assembly 300. A continuous flow of coolant is preferred to better control the temperature of the support member 310. The coolant is preferably 50 percent by volume ethylene glycol and 50 percent by volume water. Of course, any ratio of water and ethylene glycol can be used so long as the desired temperature of the substrate is maintained.

An etching gas mixture is introduced to the chamber 100 for selectively removing various oxides on a surface of the substrate 110. In one embodiment, ammonia and nitrogen trifluoride gases are then introduced into the chamber 100 to form the etching gas mixture. The amount of each gas introduced into the chamber is variable and may be adjusted to accommodate, for example, the thickness of the oxide layer to be removed, the geometry of the substrate being cleaned, the volume capacity of the plasma, the volume capacity of the chamber body 112, as well as the capabilities of the vacuum system coupled to the chamber body 112.

The ratio of the etching gas mixture may be predetermined to selectively remove various oxides on the substrate surface. In one embodiment, the ratio of ingredient in the etching gas mixture may be adjusted to uniformly remove various oxides, such as thermal oxides, deposited oxides, and/or native oxides. In one embodiment, molar ratio of ammonia to nitrogen trifluoride in the etching gas mixture may be set to uniformly remove various oxides. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). Preferably, the gases are introduced in the chamber 100 at a molar ratio of from 5:1 (ammonia to nitrogen trifluoride) to 30:1. More preferably, the molar ratio of the gas mixture is of from about 5 to 1 (ammonia to nitrogen trifluoride) to about 10 to 1. The molar ratio of the gas mixture may also fall between about 10:1 (ammonia to nitrogen trifluoride) and about 20:1.

A purge gas or carrier gas may also be added to the etching gas mixture. Any suitable purge/carrier gas may be used, such as argon, helium, hydrogen, nitrogen, or mixtures thereof, for example. Typically, the overall etching gas mixture is from about 0.05% to about 20% by volume of ammonia and nitrogen trifluoride. The remainder being the carrier gas. In one embodiment, the purge or carrier gas is first introduced into the chamber body 112 before the reactive gases to stabilize the pressure within the chamber body 112.

The operating pressure within the chamber body 112 can be variable. Typically, the pressure is maintained between about 500 mTorr and about 30 Torr. Preferably, the pressure is maintained between about 1 Torr and about 10 Torr. More preferably, the operating pressure within the chamber body 112 is maintained between about 3 Torr and about 6 Torr.

An RF power of from about 5 and about 600 Watts is applied to the electrode 240 to ignite a plasma of the gas mixture within the volumes 261, 262, and 263 contained in the gas delivery assembly 220. Preferably, the RF power is less than 100 Watts. More preferable is that the frequency at which the power is applied is very low, such as less than 100 kHz. Preferably, the frequency ranges from about 50 kHz to about 90 kHz.

The plasma energy dissociates the ammonia and nitrogen trifluoride gases into reactive species that combine to form a highly reactive ammonia fluoride ($NH_4F$) compound and/or ammonium hydrogen fluoride ($NH_4F.HF$) in the gas phase. These molecules then flow through the gas delivery assembly 220 via the holes 225A of the gas distribution plate 225 to react with the substrate surface to be processed. In one embodiment, the carrier gas is first introduced into the chamber 100, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F.HF$, reacts with the silicon oxide surface to form ammonium hexafluorosilicate $(NH_4)_2SiF_6$, $NH_3$, and $H_2O$ products. The $NH_3$, and $H_2O$ are vapors at processing conditions and removed from the chamber 100 by the vacuum pump 125. In particular, the volatile gases flow through the apertures 135 formed in the liner 133 into the pumping channel 129 before the gases exit the chamber 100 through the vacuum port 131 into the vacuum pump 125. A thin film of $(NH_4)_2SiF_6$ is left behind on the substrate surface. This reaction mechanism can be summarized as follows:

$NF_3+3NH_3 \rightarrow NR_4F+NH_4F.HF+N_2$

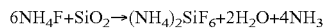

$6NH_4F+SiO_2 \rightarrow (NH_4)_2SiF_6+2H_2O+4NH_3$

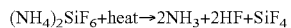

$(NH_4)_2SiF_6+heat \rightarrow 2NH_3+2HF+SiF_4$

After the thin film is formed on the substrate surface, the support member 310 may be elevated to an anneal position in close proximity to the heated gas distribution plate 225. The heat radiated from the gas distribution plate 225 may dissociate or sublimate the thin film of $(NH_4)_2SiF_6$ into volatile $SiF_4$, $NH_3$, and HF products. These volatile products are then removed from the chamber 100 by the vacuum pump 125 as described above. Typically, a temperature of 75° C. or more is used to effectively sublimate and remove the thin film from the substrate 110. Preferably, a temperature of 100° C. or more is used, such as between about 115° C. and about 200° C.

The thermal energy to dissociate the thin film of $(NH_4)_2SiF_6$ into its volatile components is convected or radiated by the gas distribution plate 225. As described above, the heating element 270 is directly coupled to the distribution plate 225, and is activated to heat the distribution plate 225 and the components in thermal contact therewith to a temperature between about 75° C. and 250° C. In one aspect, the distribution plate 225 is heated to a temperature of between 100° C. and 150° C., such as about 120° C.

The distance between the upper surface of the substrate 110 having the thin film thereon and the distribution plate 225 is not critical and is a matter of routine experimentation. A person of ordinary skill in the art can easily determine the spacing required to efficiently and effectively vaporize the thin film without damaging the underlying substrate. It is believed, however, that a spacing of between about 0.254 mm (10 mils) and 5.08 mm (200 mils) is effective.

Once the film has been removed from the substrate, the processing chamber 100 is purged and evacuated. The processed substrate is then removed from the chamber body 112 by lowering the support assembly 300 to the transfer position, de-chucking the substrate, and transferring the substrate through the slit valve opening 160.

EXAMPLE

During etching, a gas mixture of 2 sccm of $NF_3$, 10 sccm of $NH_3$ and 2,500 sccm of argon was introduced into a vacuum chamber. A plasma of the gas mixture was ignited using 100 Watts of power. 1,500 sccm of argon is supplied to a lower portion of the chamber for bottom purge. 50 sccm of argon is supplied to near the edge region of the substrate support for edge purge. The chamber pressure was maintained at about 6 Torr, and the substrate temperature was about 22° C. The substrate was etched for 120 seconds.

During anneal, the spacing between the substrate and a heated chamber lid was 750 mil and the lid temperature was 120° C. The substrate was annealed for about 60 seconds. About 50 angstroms of material was removed from the substrate surface. No anneal effect was observed. The etch rate was about 0.46 angstroms per second (28 Å/min). The observed etch uniformity was about 5% for the 50 Å etch.

Unless otherwise indicated, all numbers expressing quantities of ingredients, properties, reaction conditions, and so forth, used in the specification and claims are to be understood as approximations. These approximations are based on the desired properties sought to be obtained by the present invention, and the error of measurement, and should at least be construed in light of the number of reported significant digits and by applying ordinary rounding techniques. Further, any of the quantities expressed herein, including temperature, pressure, spacing, molar ratios, flow rates, and so on, can be further optimized to achieve the desired etch selectivity and particle performance.

Additional description of methods and apparatus for siconi etching can be found in the United States Patent Application Publication 2007/0123051, entitled "Oxide Etch with $NH_3$-$NF_3$ Chemistry", which is incorporated herein by reference.

Figure 5A:
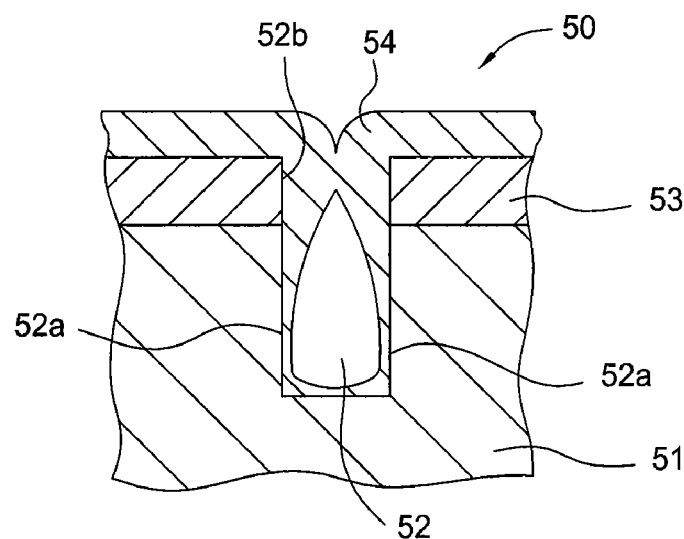
FIGS. 5A-5C schematically illustrate a method for modifying a trench profile in accordance with another embodiment of the present invention.
Figure 5B:
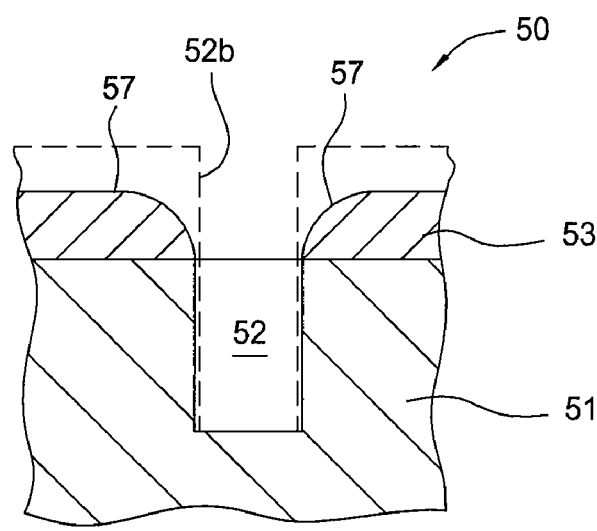

FIGS. 5A-5B schematically illustrate modifying a trench profile in accordance with another embodiment of the present invention.

As shown in FIG. 5A, a trench structure 52 is formed in a substrate 50. The trench structure 52 is formed through a first layer 53 comprising a first material, and into a second layer 51 comprising a second material. Sidewalls 52a of the trench structure 52 comprise the first material in an upper portion and the second material in a lower portion.

A sacrifice layer 54 is formed over the substrate 50 to pinch off a top opening 52b of the trench structure 52 by exposing the substrate 50 to an etchant. In one embodiment, the etchant is configured to etch both the first material and the second material by reacting with the first and second materials and to generating by-products from reactions with the first material and second material. The sacrifice layer 54 comprises the by-products generated from reactions between the etchant and the first material and between the etchant and the second material.

In one embodiment, the etchant etches the first material much faster than the etchant etches the second material. As shown in FIG. 5A, the etchant reacts to the first material fast and the sacrifice layer 54 pinches off the top opening 52b comprising the first material, while the etchant reacts relative slow with the second material and the sacrifice layer 54 is very thin down the bottom portion of the trench structure 52.

In one embodiment, the first material comprises silicon oxide, the second material comprises a low-k material, and the etchant comprises a mixture of ammonia and nitrogen trifluoride which etches silicon oxide much faster than it etches low-k material.

Similar to the process 30 described above, the etchant may be continuously flown the substrate 50 to further react with the first material and the second material by diffusing through the sacrifice layer 54. According, more material can be etched. However, the etching rate slows down along the sidewalls 52. In one embodiment, etching time and/or etchant flow rate may be varied for an ideal trench widening.

Next, the sacrifice layer 54 is removed exposing a modified trench profile 57 as shown in FIG. 5B. The original trench profile is shown in dashed line of FIG. 5B. Comparing the original trench profile and the modified trench profile 57, it shows that more material has been removed from the upper portion of the trench structure 52, rendering a widened top opening.

In one embodiment, formation of the sacrifice layer 54, continued etching, and removal of the sacrifice layer 54 may be performed in the same processing chamber, such as the processing chamber 100 of FIG. 4.

Figure 5C:
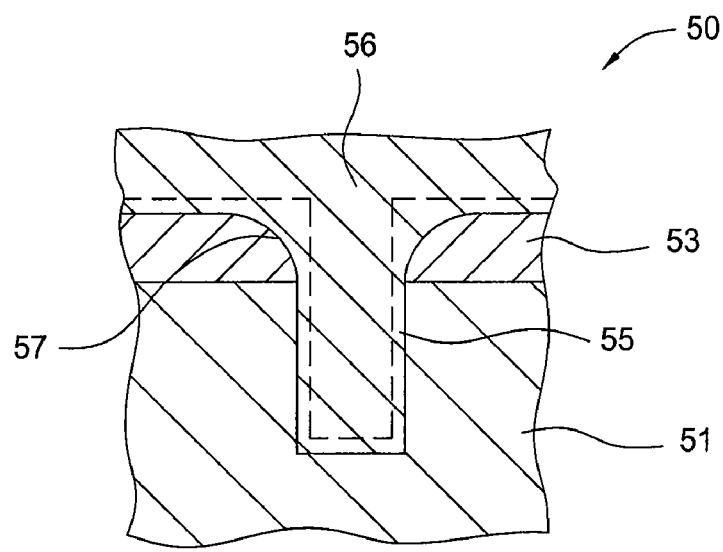

FIG. 5C schematically illustrates the substrate 50 a subsequent formation of a liner film 55 and a filling material 56. The widened trench profile allows the filling material 56 to form in the trench structure 52 without formation of voids.

Even though, a dry etching method is described here, any suitable etchant that works by reacting with material being etched and generating a by-product can be used in accordance with embodiment of the present invention.

Embodiments of the present invention can be used in any situation that calls for trench and/or via profile modification. For example, embodiments of the present invention can be used to modify trench and via profile prior to depositing a conductive material, such as copper or aluminum, to form chip interconnection. Embodiments of the present invention can also be used to modify trench and via profile prior to Germanium-Selenium-Tellurium (GST) filling in manufacturing phase change memory cells. Embodiments of the present invention can also be used to modify trench and/or via profile prior to gate metal filling in fabricating transistors.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    forming a structure in a base layer on the substrate, wherein the structure has a bottom, a top opening and sidewalls extending from the bottom to the top opening, and the bottom and sidewalls of the structure comprise a first material;
    flowing an etchant at a first flow rate to form a sacrifice layer to pinch off the top opening, wherein the sacrifice layer comprises a by-product of a reaction between the etchant and the first material;
    allowing the etchant to further react with the first material by continuously exposing the substrate to the etchant; and
    removing the sacrifice layer from the substrate.

2. The method of claim 1, wherein the allowing the etchant to further react is configured to remove the first material by reacting with the first material and generating the by-product.

3. The method of claim 2, wherein the flowing an etchant to form a sacrifice layer comprises:
    increasing the first flow rate to increase a ratio of an etch rate near the top opening of the structure and an etch rate near a bottom of the structure.

4. The method of claim 3, wherein the etchant comprises a first processing gas and a second processing gas, and increasing the first flow rate comprises increasing the flow rate of the first processing gas.

5. The method of claim 2, wherein the first material comprises one of a silicon oxide, silicon nitride, or combinations thereof, and the etchant comprises a fluorine, nitrogen, and hydrogen containing source.

6. The method of claim 2, wherein the flowing an etchant to form the sacrifice layer comprises exposing the substrate to a plasma generated from the etchant.

7. The method of claim 6, wherein the plasma is remotely generated and flown to a processing chamber where the substrate is disposed.

8. The method of claim 6, wherein the plasma is generated in-situ in a processing chamber where the substrate is disposed.

9. A method for processing a substrate, comprising:
    forming a structure in a base layer on the substrate, wherein the structure has a bottom, a top opening and sidewalls extending from the bottom to the top opening, and the bottom and sidewalls of the structure comprise a first material;
    widening the top opening of the structure comprising:
        forming a sacrifice layer to pinch off the top opening of the structure by exposing the substrate to an etchant, wherein the sacrifice layer comprises a by-product of an reaction between the etchant and the first material;
        allowing the etchant to further react with the first material by continuously exposing the substrate to the etchant; and
        removing the sacrifice layer from the substrate; and
    depositing a second material to fill the structure.

10. The method of claim 9, wherein allowing the etchant to further react is configured to remove the first material by reacting with the first material to generate the by-product.

11. The method of claim 10, wherein the forming a sacrifice layer comprises:
    determining a first flow rate of the etchant to allow the by-product to pinch off the top opening; and
    flowing the etchant at the first flow rate to pinch off the top opening.

12. The method claim 11, wherein the widening a top opening further comprises:
    increasing the first flow rate to increase degree of widening.

13. The method of claim 11, wherein:
    the first material comprises one of silicon nitride, silicon oxide, or combination thereof, and
    the etchant comprises one of a mixture of nitrogen trifluoride ($NF_3$) and ammonia ($NH_3$), a mixture of nitrogen trifluoride ($NF_3$) and hydrogen ($H_2$), a mixture of nitrogen trifluoride ($NF_3$), hydrogen ($H_2$), and nitrogen ($N_2$), a mixture of nitrogen trifluoride ($NH_3$) and hydrogen fluoride (HF), or other similar fluorine, nitrogen, and hydrogen containing source.

14. The method of claim 13, wherein the second material comprises one of a conducting material for interconnection, Germanium-Selenium-Tellurium (GST) filling for phase change memory, or gate metal filling for metal gate.

15. The method of claim 13, wherein the removing the sacrifice layer comprises annealing the substrate.

16. The method of claim 9, further comprising:
    prior to widening the top opening, depositing a liner layer over the substrate, wherein the liner layer comprises the first material.

17. A method for processing a substrate, comprising:
    positioning the substrate in a processing chamber, wherein the substrate has a structure formed in a base layer on the substrate, wherein the structure has a bottom, a top opening and sidewalls extending from the bottom to the top opening, and the bottom and sidewalls of the structure comprise a first material;

flowing a first processing gas to the processing chamber to form a sacrifice layer to pinch off a top opening of the structure;

continuing the flow of the first processing gas after the top opening has been pinched off; and annealing the substrate to remove the sacrifice layer from the structure.

18. The method of claim 17, further comprising:

determining a first flow rate of the first processing gas to allow the by-product to pinch off the top opening of the structure, wherein the first processing gas is configured to remove the first material by reacting with the first material to generate the by-product.

19. The method of claim 18, wherein the determining a first flow rate comprises:

increasing the first flow rate for a more widened top opening after the sacrifice layer is removed; and decreasing the first flow rate for a less widened top opening after the sacrifice layer is removed.

20. The method of claim 19, wherein the first processing gas comprises one of a mixture of nitrogen trifluoride ($NF_3$) and ammonia ($NH_3$), a mixture of nitrogen trifluoride ($NF_3$) and hydrogen ($H_2$), a mixture of nitrogen trifluoride ($NF_3$), hydrogen ($H_2$), and nitrogen ($N_2$), a mixture of nitrogen trifluoride ($NF_3$) and hydrogen fluoride (HF), or other similar fluorine, nitrogen, and hydrogen containing source.

* * * * *

UNITED STATES PATENT AND TRADEMARK OFFICE
CERTIFICATE OF CORRECTION

PATENT NO. : 8,268,684 B2  
APPLICATION NO. : 13/205379  
DATED : September 18, 2012  
INVENTOR(S) : Chang et al.

Page 1 of 1

It is certified that error appears in the above-identified patent and that said Letters Patent is hereby corrected as shown below:

In Detailed Description:

Column 9, Line 28, please delete "$NF_3 + 3NH_3 \rightarrow NH_4F + NH_4F.HF + N_2$" and insert -- $NF_3 + 3NH_3 \rightarrow NH_4F + NH_4F \cdot HF + N_2$ -- therefor.

Signed and Sealed this  
First Day of January, 2013

David J. Kappos  
*Director of the United States Patent and Trademark Office*